United States Patent [19]

Connery

[11] Patent Number: 4,828,627

[45] Date of Patent: May 9, 1989

[54] THERMOELECTRIC MODULE OPTIMIZED FOR LOW TEMPERATURE DIFFERENCE

[75] Inventor: Colin A. Connery, New York, N.Y.

[73] Assignee: Living Water Corporation, Mt. Vernon, N.Y.

[21] Appl. No.: 92,194

[22] Filed: Sep. 2, 1987

[51] Int. Cl.[4] .................................... H01L 35/28
[52] U.S. Cl. ................................. 136/203; 136/212
[58] Field of Search ............................ 136/203, 212

[56] References Cited

U.S. PATENT DOCUMENTS

| | | | |
|---|---|---|---|
| 3,531,330 | 9/1970 | Elfving | 136/203 |
| 3,726,100 | 4/1973 | Widakowich | 136/203 X |
| 3,943,553 | 3/1976 | Elfving et al. | 136/212 X |
| 4,004,210 | 1/1977 | Yater | 136/203 X |
| 4,007,061 | 2/1977 | Le Couturier | 136/203 X |
| 4,166,390 | 9/1979 | Benzinger | 136/212 X |
| 4,306,426 | 12/1981 | Berthet | 136/203 |
| 4,492,809 | 1/1985 | Dahlberg | 136/212 |
| 4,687,879 | 8/1987 | Hendricks | 136/212 |

Primary Examiner—Peter A. Nelson
Attorney, Agent, or Firm—Clement and Ryan

[57] ABSTRACT

A structure for joining thermoelectric and heat exchange elements in series so that the combination can be operated as a heat pump, at an elevated voltage with high efficiency when transporting high heat flux levels across very small temperature differences.

2 Claims, 1 Drawing Sheet

THERMOELECTRIC MODULE OPTIMIZED FOR LOW TEMPERATURE DIFFERENCE

FIELD OF THE INVENTION

This invention relates to a thermoelectric module, and in particular such a module having a geometric specification for the assembly of P and N semiconductor thermoelectric elements and electrically conductive heat exchange elements that may be most readily optimized for energy efficient operation when the temperature difference between the heat source and sink is small.

BACKGROUND OF THE INVENTION

In recent decades, advances in the understanding of semiconductor materials have made possible the fabrication of thermoelectric heat pumps based on the Peltier effect that have efficiencies adequate for applications in many specialized situations that are characterized by (1) moderate to low temperature differences, (2) low heat flux levels and (3) requirements of low weight, small size and high reliability.

However, wider use of thermoelectrics in cooling and heating applications has been limited by the fact that at increased heat flux levels, vapor compression heat pumps have better efficiency and lower cost than the thermoelectric modules that are now available moreover.

There is a widely held belief within the industry that little further improvement is possible with currently availabe thermoelectric materials. This point is made in a typical manner by H. J. Goldsmid in his book, *THERMOELECTRIC REFRIGERATION* (Plenum Press, 1964) on page 210: "The precise level of cooling power below which the thermoelectric method is preferable depends on a number of factors, but for most purposes it is about ten watts and will remain in this region until there is a substantial improvement in the figure of merit of the thermoelectric elements."

Such an understanding of thermoelectricity ignores what is certainly one of its most valuable attributes. This is the fact that the thermoelectric element, when operating as a heat pump, is unlike a vapor compression system in that it does not experience a profound drop in the "reduced coefficient of performance" (actual efficiency as compared to the ideal Carnot efficiency) when it operates across a very small temperature difference.

When a vapor compression pump is operating across a large temperature difference, most of the input energy is absorbed in useful compression, with friction and hydrodynamic losses being only a small fraction of the overall energy picture. However, when the temperature difference between the heat source and the heat sink approaches zero, little useful compression occurs, while the friction and hydrodynamic losses are undiminished. As a result, the reduced coefficient of performance becomes vanishingly small.

In contrast, an optimized thermoelectric element will exhibit a monotonic increase in the reduced coefficient of performance as the temperature difference approaches zero. Moreover, the quantity of semiconductor material in an optimized element of fixed heat transport capacity also approaches zero as the temperature difference approaches zero.

It therefore follows that for all heat flux levels that fall between temperature differences less than some specific value, thermoelectric heat pumps are cheaper to operate and less expensive to build than vapor compression devices.

To the knowledge of this inventor, this fact is nowhere exploited or explicitly stated.

The reason why this potential has not been recognized or exploited involves several factors that have worked together to prevent the optimization of thermoelectric heat pumps for low temperature differences.

A major barrier has been the more common use of thermoelectric elements as power generators in addition to their heat pump applications. When used as a power source based on the Seebeck effect a thermoelectric element must be optimized for operation across a large temperature difference, because the Second Law of Thermodynamics limits accessible power to very small precentages of heat flux when the temperature difference is small.

Although the situation is reversed for a heat pump—where the Second Law allows increasingly efficient heat transport as the temperature difference is decreased—the driving force in thermoelectric research has remained the power generating potential. As a result, the hardware available for refrigeration apparatus has often been limited by the need to play a dual role.

Another problem is that the common manner in which thermoelectric modules are assembled employs a structure which can not be optimized for very low temperature differences. Specifically, the need to separate the heat source and heat sink from the thermoelectric element by means of an electrical insulator introduces two unreduceable heat insulating elements into the thermal circuit, which have a profound effect on module performance when operating across small temperature differences. Although these electrical insulators are not theoretically required for the design of thermoelectric devices, they are necessary in this standard structure.

A third barrier to understanding has been the preponderance of applications which are characterized by large temperature differences. That the applications characterized by low temperature differences are few in number falsely suggests that this an area of minor significance. In fact some of these applications have very great economic importance. For example, distillation of water and other liquids by either boiling-condensation or the freeze-melt cycle is most efficient when driven by a heat pump operating across a very small temperature difference.

OBJECTS OF THE INVENTION

The thermoplastic module of my invention provides a practical means for connecting the P and N semiconductor elements in series without the need to insert heat insulating electrical insulators in the heat conduction path, thereby providing a conveniently high operational voltage without having to degrade the thermal performance of the heat pump.

Another object of my invention is to provide an assembly in which there is a minimum of surplus material, so that the cost of materials is kept to a minimum.

Another object of my invention is to provide a structure, composed only of flat rectangular homogeneous elements in which physical dimensioning is very uncritical so that the cost of preparing the elements for assembly is minimized.

Another object of my invention is to provide a structure that exhibits excellent volumetric efficiency, and in which the physical aspect ratio of the exchanger is a convenient value near unity.

Another object of my invention is to provide a structure that lends itself to manufacture by simple uncritical assembly techniques, and eliminates the need for precision finishing operations.

Another object of my invention is to provide a combined thermoelectric heat pump and heat exchanger module, which may be divided (sliced up) into any number of smaller heat pump/exchanger modules by means of simple straight cuts such that the resulting smaller devices, apart from operating at lower power levels, will exhibit unchanged operational characteristics.

Another object of my invention is to provide a structure that lends itself to the multiple staging of cooling modules, and benefits from all the above described advantages.

SUMMARY OF THE INVENTION

Optimizing a thermoelectric element for operation as a heat pump across a given temperature difference is a simple matter involving the consideration of three factors: The Peltier (cooling) coefficient, the bulk electrical resistivity and the bulk heat conductivity of the semiconductor material.

The thermoelectric element operates by taking advantage of the fact that electrical current carriers, either negative electrons or positive "holes," also transport heat in their movement from one end of the conductor to the other. The diminished performance of the thermoelectric element arises from the unwanted input of heat due to Joule (electrical resistive) heating within the semiconductor material and the loss of useful heat transfer due to temperature mixing as a result of the conduction of heat from the hot to the cold end through the body of the element. Hence one seeks to chose the best compromise in length, so that neither Joule heating nor temperature mixing cause disproportionate losses.

Since both of these variables with respect to length are monotonic functions of opposite sign, there is one and only one best value for the distance between the hot and cold ends for any particular temperature drop and semiconductor material. Also, for small temperature differences, over which the Peltier coefficient may be treated as constant, the optimum length for other temperature differences might be deduced from this initial calculation by making the length of the element a direct function of temperature difference.

From the above analysis we can deduce why the reduced coefficient of performance for a thermoelectric module actually climbs as the temperature difference becomes smaller. Under conditions of constant current, when we cut the temperature difference in half and maintain optimization by also cutting the length of the element in half, we will observe that the voltage, input power and Joule heating are also halved. Thus, ignoring the Joule heating, we observe that the efficiency of the element as a heat pump doubles, implying no reduction in the reduced coefficient of performance. However, we have also divided the Joule heating by two without reducing the quantity of heat that is being transported from the warm to the cold end. Thus, that portion of the cold lost to Joule heating is halved, and the reduced coefficient of performance is thereby actually increased.

This gain in efficiency is not very significant in a single stage device but is of great significance in a multi-stage device, where a small gain in efficency for each stage will combine for a significant improvement in overall performance.

The optimum voltage drop across a single thermoelectric element is normally a small fraction of one volt. Accordingly, it has been found necessary to join many elements in series so that the voltage and current requirements may be adjusted to more convenient values. The manner in which this is done may be likened to the task of joining flashlight batteries in series.

In a flashlight, cells can be pressed together axially (head-to-tail) head to tail or they may be placed side-by-side with contactor strips joining adjacent cells alternately on the top and bottom of the battery pack.

For the purpose of joining thermoelectric elements it has been assumed that side-by-side is the only practical method of connection, because this has the advantage of grouping together the jot junctions on one plane with the cold junctions on the opposing parallel plane. However, this creates several difficulties.

As has been already noted, it is not possible to connect the standard metallic heat exchanger directly to the hot or cold junction planes because the metal would short circuit the current path. There must first be interposed an electrical insulator between the connector strips and the metallic heat exchanger. Since all common electrical insulators are also poor heat conductors, this introduces two unreduceable heat insulating elements in the thermal circuit.

A second problem associated with this structure is that the various elements must be manufactured to very tight tolerances. The problem is akin to manufacturing stools that have more than three legs. With only three legs of varying lengths, all three will rest securely on the ground. With more than three legs an odd length leg will insure that at least one leg does not reach the group. Likewise an odd length thermoelectric element will prevent some of the elements from making good thermal contact with the flat heat transfer surface.

Another problem with the parallel structure is that it is inflexible with regard to the three design parameters of voltage drop, temperature difference and heat flux. A separate design is necessary for each unique combination of these three parameters if the module is to be fully optimized. In practice only a limited number of modules are commercially available. As a result, thermoelectric systems are rarely fully optimized.

The configuration that I have adopted is like the alternative configuration for flashlight batteries in that I have combined electrically conductive heat exchange elements with the N and P semiconductor thermoelectric elements in series along a common axis. Each element is flat and, typically, rectangular and together they form a stack somewhat like a stack of cards. The rectangular heat exchange elements are physically longer in one dimension than the thermoelectric elements. The hot heat exchange elements alternate with cold exchange elements and are separated from each other by alternating N and P layers. The hot exchange elements extend outward from the stack along one side, while the cold exchange elements extend outward along the opposite side. An electric circuit is made between the top and bottom of the stack, passing through the thermoelectric elements and the heat exchange elements, with current flowing in the direction that will render the junctions formed by cold exchange elements cold and the hot exchange elements hot.

In many heat exchange situations the heat exchange surfaces are intended to exchange heat with a gas or liquid. In those cases where the fluid is an electric insulator the electrically conductive heat exchange elements may be left uninsulated. Where the fluid is a conductor, the heat exchange elements may be insulated by a variety of techniques. For example, if the heat exchange elements are aluminum, the metal can be anodized. The advantages of insulating the system at the fluid/heat exchanger junction rather than the thermoelectric element/heat exchanger junction is that a thinner insulating film may be used since the fluid is much less likely to mechanically pierce the insulation. Also, the greater surface area of the exchanger will decrease the thermal resistance of the insulation layer.

Another advantage of joining the various elements of the module along a single common axis is that substantial variations in the nominal dimensions of the individual elements may be tolerated because there is no problem involving mismatch with the other elements.

Another advantage of this configuration is that the module is usually differentiated in only two dimensions. Thus it may be treated as though it were an extruded piece such that lower powered thermoelectric modules may be sliced off large preassembled modules while preserving the optimized voltage and temperature characteristics. Moreover, although this structure is more complicated than the typical extrusion, it may be possible to realize continuous manufacture by means of an extrusion like process.

DESCRIPTION OF THE PREFERRED EMBODIMENT

Figure 1:
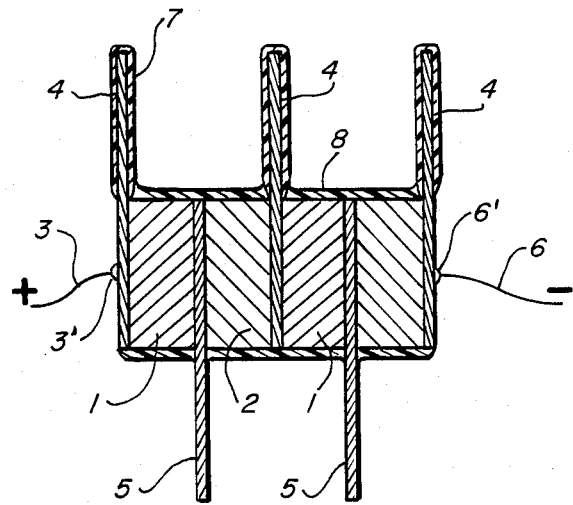
FIG. 1 is a cross section view of a single stage device in accordance with the invention.

FIG. 1 presents a cross section view of a thermoelectric module comprised of two N semiconductor thermoelectric elements 1, and two P semiconductor thermoelectric elements 2. Although, I have illustrated a module possessing only two semiconductor pairs, a practical module would contain many more by repeating the illustrated pattern in the horizontal direction in FIG. 1 as many as necessary to achieve a convenient operating voltage. Likewise, in the interests of clarity the thermoelectric elements are shown to be thicker than would normally be the case.

The electric current path through the module passes from the positive lead 3, attached at terminal 3' to the hot heat exchange plate 4, through the N element 1, and from there through the adjoining cold heat exchange plate 5, into the P element 2, and then the next hot heat exchange plate 4, and the next N element 1, and the next cold plate 5, and the next P element 2, and finally exits the module through the last hot exchange plate 4, and out to negative conductor lead 6 through 6'.

The metallic heat exchange plates 4, and 5, are bonded to the thermoelectric elements 1, and 2, by means of solder or some other means (not shown) that will insure that excellent electrical and thermal conductivity is achieved at the interfaces between adjoining parts.

An advantage of this structure is that pretinned parts may be pressed together and soldered in a single operation. Also, the tolerance in the thickness of the parts is not critical because they are stacked along a common axis (horizontal in FIG. 1).

The heat exchange plates 4 and 5 as illustrated are well adapted for exchanging heat with fluids. In the case where the fluid is electrically conductive the heat exchange plates 4 and 5 will need a protective layer of electrical insulation 7. This layer can usually be made very thin because the voltage drop between adjacent plates is normally only a small fraction of one volt. Also, because of this low voltage, pinhole leaks in the insulation can be tolerated without greatly compromising efficiency.

In the module illustrated in FIG. 1, only the hot exchange plates 4 are shown to be insulated. As an example illustrating the application of such a module, the hot exchange plates 4 facing upward might be used to boil sea water with the vapor passing to the lower cold exchange plates 5, where the water vapor would condense and drain off into a collector. Because the distilled water and the water vapor are good insulators, it would not be necessary to electrically insulate the cold exchange surfaces 5.

In such a distiller the boiling and condensing temperature can be made very close, thereby achieving excellent thermodynamic efficiency due to the sustained reduced coefficient of performance that characterizes semiconductor thermoelectric elements when incorporated in a module in accordance with my invention.

Another very common circumstance where the hot exchange plates may be left uninsulated is when the heat is being discharged to air. The air, of course, is not electrically conductive.

In this application, my invention proves very economical with regard to the cost of materials and fabrication because of the ease with which very compact, large surface area heat exchangers may be fabricated from simple, uncritical flat stock whichis incorporated into the modules as part of a single-step assembly operation.

One problem with my structure is that a small portion of the thermoelectric elements on the hot and cold sides of the module are exposed to the heat transport fluids. This can result in unwanted temperature mixing and chemical contamination unless protective insulating material 8 is interposed between the exposed surfaces and the fluids. The amount of this insulation and its significance as an unwanted heat conduction path diminishes as the temperature difference between the hot and cold sides approaches zero, because the exposed area and the temperature driving force will also approach zero. It is because of this source of temperature mixing that this module is best used where the temperature differences are small. However, the many other advantages that characterize this structure may make it desirable even where the temperature differences are moderate or large.

Figure 2:
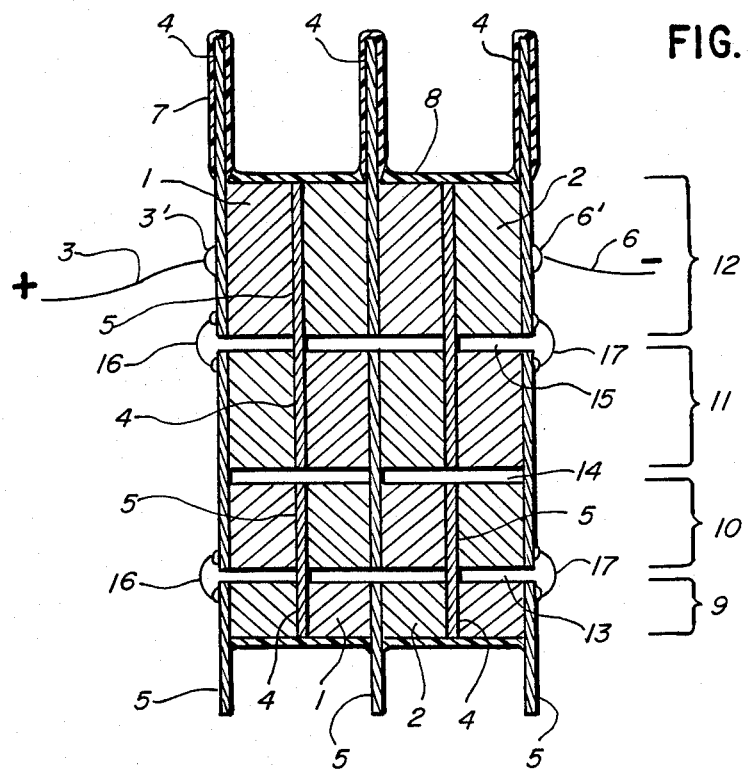
FIG. 2 is a cross section view of a multiple stage device in accordance with the invention.

FIG. 2 presents a cross section view of a four stage thermoelectric module that includes first stage 9, second stage 10, third stage 11 and fourth stage 12. Stages 9 and 10 are separated by gap 13, stages 10 and 11 by gap 14, and stages 11 and 12 by gap 15.

Each stage consists of two thermoelectric element pairs. Although I have illustrated a module in which each stage possess only two semiconductor pairs, a practical module would contain many more by repeating the illustrated pattern in the horizontal direction in FIG. 2 as many as necessary to achieve a convenient operating voltage.

The fourth stage 12, at the hot end of the module, will be observed to be identical in structure to the single stage module illustrated in FIG. 1. The explanation for its operation is likewise identical to that provided for the device illustrated in FIG. 1.

The cold heat exchange plates 5 of the fourth stage 12 become the hot heat exchange plates 4 of the third stage 11, as the plate passes from the fourth to the third stage. Interlocking the stages in this manner permits very high efficiency in heat exchange between the stages while preserving the low cost of materials and manufacture.

In order to interlock the stages in this manner it is necessary that the thickness (in the horizontal direction in FIG.2) of the respective semiconductor thermoelectric elements 1 and 2 in stages 9 through 12 be the same. This constraint implies that fully optimized thermoelectric elements 1 and 2 must experience the same temperature drop. It happens that this is desirable since a multi-stage device is normally optimized by dividing the hot and cold temperature drop equally among the stages.

The current path through the fourth stage 12, is as described in FIG. 1. Jumper wires 16 and 17, respectively, connect the positive and negative leads 3 and 6 to the three other stages. This is possible because the thickness and number of thermoelectric elements 1 and 2 in all stages are the same and therefore the voltage drop will be the same across each stage. It will be observed in FIG. 2 that the width (in the vertical direction in that Figure) of thermoelectric elements 1 and 2 varies such that the elements become progressively larger for stages operating at higher temperatures. This is because the upper stages must transport the Joule heaing of the lower stages in addition to the heat being drawn from the cold end of the module.

Although I have chosen to illustrate a four stage device, any number of stages may be incorporated in the manner described.

The above detailed description has been given for clearness of understanding only. No unnecessary limitations should be understood therefrom, as modifications will be obvious to those skilled in the art.

I claim:

1. A thermoelectric heat pump module which comprises,
    (a) a plurality of thin, flat electric and heat conductive plates;
    (b) a plurality of flat, rectangular thermoelectric N and P semiconductor elements;
    (c) an electric and heat conductive bonding mechanism suitable for joining said electric and heat conductive plates to said N and P semiconductor elements so as to form a single laminated structure such that the top layer of said laminated structure is a first of said conductive plates joined by said bonding mechanism to one side of a first of said N (or P) thermoelectric elements, said first conductive plate having at least one edge extending outward from said laminated structure, said first N (or P) thermoelectric element being joined on its second side by said bonding mechanism to one side of a second of said conductive plates, said second conductive plate having at least one edge extending outward from said laminated structure, said outwardly extending edge of said second conductive plate being non adjacent to said outwardly extending edge of said first conductive plate, said second conductive plate being joined on its second side by said bonding mechanism to one side of a first of said P (or N) thermoelectric elements such that said P (or N) thermoelectric element is parallel to and aligned with all the other of said P and N thermoelectric elements, said first P (or N) thermoelectric element be joined by said bonding mechanism on its second side to one side of a third of said conductive plates such that said third conductive plate is parallel to and aligned with said first conductive plate, said laminated structure having as many additional layers as needed to achieve a desired operational voltage such that the sequence for all subsequent layers following the third of said heat conductive plates is an alternating series beginning with said N (or P) thermoelectric elements alternating with said P (or N) thermoelectric elements, said N and P thermoelectric elements being separated from each other by said conductive plates such that the fourth, sixth and all subsequent even numbered of said conductive plates are parallel to and aligned with the second of said conductive plates; and the fifth, seventh and all subsequent odd numbered of said conductive plates are aligned along a common axis with the first and third of said conductive plates, with the last layer of said laminated structure being one of said conductive plates, said thermoelectric module being energized by passing an electric current through said laminated structure in a path perpendicular to said laminations, said current entering at the first of said conductive plates and exiting at the last of said conductive plates.

2. A thermoelectric heat pump module comprised of a plurality of heat pump stages, each of said stages as described in claim 1, said stages being thermally joined to each other by having said outwardly extending edges of said conductive plates being joined to said outwardly extending edges of the adjoining stages such that said joined conductive plates of said adjoining stages form a single, unbroken flat conductive plate originating in one stage and terminating in the adjoining stage.

* * * * *

UNITED STATES PATENT AND TRADEMARK OFFICE
CERTIFICATE OF CORRECTION

PATENT NO. : 4,828,627
DATED : May 9, 1989
INVENTOR(S) : Colin A. Connery

It is certified that error appears in the above-identified patent and that said Letters Patent is hereby corrected as shown below:

Col. 2, line 54, "thermoplastic" should be -- thermoelectric --.

Col. 4, line 38, "group" should be -- ground --.

Col. 5, line 46, delete the comma after "Although".

Col. 5, line 62, after "through" insert -- terminal --.

Col. 6, line 40, "whichis" should be -- which is --.

Col. 7, line 34, "heaing" should be -- heating --.

Col. 8, line 19, "be" should be -- being --.

Signed and Sealed this

Thirteenth Day of March, 1990

Attest:

JEFFREY M. SAMUELS

Attesting Officer

Acting Commissioner of Patents and Trademarks